United States Patent
Sweere

(10) Patent No.: US 9,016,552 B2
(45) Date of Patent: Apr. 28, 2015

(54) METHOD FOR FORMING INTERPOSERS AND STACKED MEMORY DEVICES

(71) Applicant: Sanmina Corporation, San Jose, CA (US)

(72) Inventor: Paul Sweere, San Jose, CA (US)

(73) Assignee: Sanmina Corporation, San Jose, CA (US)

( * ) Notice: Subject to any disclaimer, the term of this patent is extended or adjusted under 35 U.S.C. 154(b) by 0 days.

(21) Appl. No.: 14/216,517

(22) Filed: Mar. 17, 2014

(65) Prior Publication Data

US 2014/0263585 A1 Sep. 18, 2014

Related U.S. Application Data

(60) Provisional application No. 61/800,801, filed on Mar. 15, 2013.

(51) Int. Cl.
*B23K 31/02* (2006.01)
*H01L 23/00* (2006.01)
*H05K 3/46* (2006.01)
*B23K 1/00* (2006.01)

(52) U.S. Cl.
CPC ............... *H01L 24/17* (2013.01); *H05K 3/4697* (2013.01); *Y10T 29/49165* (2013.01); *B23K 1/0016* (2013.01); *B23K 2201/42* (2013.01)

(58) Field of Classification Search
None
See application file for complete search history.

(56) References Cited

U.S. PATENT DOCUMENTS

| | | | | |
|---|---|---|---|---|
| 5,941,447 A * | 8/1999 | Chu et al. | ................ | 228/180.21 |
| 6,159,757 A * | 12/2000 | Kamimura et al. | ............ | 438/19 |
| 6,213,376 B1 * | 4/2001 | Correia et al. | ............... | 228/44.7 |
| 6,756,251 B2 * | 6/2004 | Lee | ................ | 438/108 |
| 6,782,610 B1 * | 8/2004 | Iijima et al. | ..................... | 29/827 |
| 7,820,526 B2 * | 10/2010 | Yamada et al. | ............... | 438/458 |
| 8,183,091 B2 * | 5/2012 | Uchiyama et al. | ............ | 438/113 |
| 8,485,418 B2 * | 7/2013 | Eldridge et al. | ........... | 228/179.1 |
| 8,883,614 B1 * | 11/2014 | Lei et al. | ....................... | 438/460 |
| 2002/0115235 A1 * | 8/2002 | Sawada | ......................... | 438/113 |
| 2003/0016036 A1 * | 1/2003 | Ahn et al. | ..................... | 324/754 |
| 2003/0045031 A1 * | 3/2003 | Kobayashi | .................... | 438/113 |
| 2003/0052098 A1 * | 3/2003 | Kim et al. | ................ | 219/121.68 |
| 2003/0232488 A1 * | 12/2003 | Chua et al. | ...................... | 438/460 |
| 2004/0034993 A1 * | 2/2004 | Rybka et al. | .................... | 29/623 |
| 2004/0113283 A1 * | 6/2004 | Farnworth et al. | ............. | 257/782 |
| 2004/0241962 A1 * | 12/2004 | Nagai | ............................ | 438/460 |
| 2005/0158968 A1 * | 7/2005 | Nagai | ............................ | 438/464 |
| 2005/0167798 A1 * | 8/2005 | Doan | ............................. | 257/678 |
| 2005/0170613 A1 * | 8/2005 | Murata et al. | ................. | 438/460 |
| 2005/0269023 A1 * | 12/2005 | Furui et al. | ..................... | 156/257 |
| 2006/0043533 A1 * | 3/2006 | Lake | ............................. | 257/618 |

(Continued)

*Primary Examiner* — Kiley Stoner
(74) *Attorney, Agent, or Firm* — Loza & Loza, LLP; Julio M. Loza

(57) ABSTRACT

Methods for forming a stacking interposer are provided that create a more compact and/or reliable interposer cavity. According to one method, a segmentation process that partially cuts a multi-cell, multi-layer PCB panel to a controlled depth along the internal walls/edges of a cavity region with each of the interposer cell sites defined within the PCB panel is used. The material within the cavity region is then removed (by routing) to a controlled depth to form the internal cavity for each interposer cell site. Pillars may then be removed from the PCB panel. As a result of the initial partial cuts of the internal walls of the cavity region, the corners of the cavities may have a square configuration for fitting over the top of a BGA/memory device (which has very square corners).

16 Claims, 7 Drawing Sheets

(56) References Cited

U.S. PATENT DOCUMENTS

| | | |
|---|---|---|
| 2006/0113286 A1* | 6/2006 | Furui .................. 219/121.72 |
| 2006/0211220 A1* | 9/2006 | Sakaya et al. ............. 438/464 |
| 2006/0289972 A1* | 12/2006 | Nishimura et al. .......... 257/666 |
| 2007/0128834 A1* | 6/2007 | Nakamura ................ 438/460 |
| 2007/0176181 A1* | 8/2007 | Kusunoki ................. 257/79 |
| 2008/0001699 A1* | 1/2008 | Gardner et al. ............ 336/200 |
| 2008/0197484 A1* | 8/2008 | Sasaki et al. .............. 257/723 |
| 2008/0299745 A1* | 12/2008 | Morikazu ................. 438/463 |
| 2009/0191693 A1* | 7/2009 | Iizuka .................... 438/463 |
| 2009/0203192 A1* | 8/2009 | Kaltalioglu et al. ......... 438/462 |
| 2009/0261480 A1* | 10/2009 | Martin et al. .............. 257/777 |
| 2010/0297855 A1* | 11/2010 | Morikazu et al. ........... 438/795 |
| 2010/0304550 A1* | 12/2010 | Moriwaka ................ 438/458 |
| 2011/0124181 A1* | 5/2011 | Suzuki et al. .............. 438/464 |
| 2011/0128713 A1* | 6/2011 | Kawano et al. ............. 361/784 |
| 2012/0018194 A1* | 1/2012 | Maeda et al. .............. 174/251 |
| 2012/0080673 A1* | 4/2012 | Winter ................... 257/48 |
| 2012/0244682 A1* | 9/2012 | Tanaka .................. 438/464 |
| 2012/0309169 A1* | 12/2012 | Endo ..................... 438/462 |
| 2013/0230974 A1* | 9/2013 | Martinez et al. ............ 438/464 |
| 2014/0065767 A1* | 3/2014 | Sugiyama et al. ........... 438/107 |
| 2014/0206177 A1* | 7/2014 | Ogawa et al. .............. 438/462 |

* cited by examiner

METHOD FOR FORMING INTERPOSERS AND STACKED MEMORY DEVICES

CLAIM OF PRIORITY

The present Application for Patent claims priority to U.S. Provisional Application No. 61/800,801 entitled "Method for Forming Interposers and Stacked Memory Devices", filed Mar. 15, 2013, which is hereby expressly incorporated by reference.

FIELD

Various features relate to improvements to semiconductor packaging technology, and more particularly, to a device and method for stacking ball grid array (BGA) packages and the formation of stacking interposers.

BACKGROUND

The design of memory subsystems has become more complex as the need for higher speeds and Dynamic Random Access Memory (DRAM) densities continue to increase with an on-going requirement for smaller memory module form factors. Small memory module form factors such as Small Outline Dual In-Line Memory Modules (SO-DIMMs), Mini-Dual In-Line Memory Modules (Mini-DIMMs), and Very Low Profile (VLP) Dual In-Line Memory Modules (DIMMs) generally use specialized DRAM packaging technologies to achieve high density solutions.

As the complexity and level of integration increases, the number of devices and consequently the number of pins of an integrated circuit package that need to be connected to a circuit board becomes larger and larger. Ball Grid Array (BGA) is a well-known packaging technique that is used to permanently mount devices, such as microprocessors, to a circuit board. A BGA can provide more interconnection pins than can be put on a dual in-line or flat package as solder balls are located on the underside for surface mounting. To place the additional devices on the circuit board, typical BGA stacking techniques are used. However, typical BGA stacking techniques require an interposer printed circuit board (PCB) to join upper and lower memory devices electrically or mechanically together into a single standalone stacked component.

Consequently, devices and packaging methods are needed that minimize interposer size, and can mount an upper BGA chip over a lower BGA chip in an efficient process. Furthermore, compact interposers that permit a greater density of devices to be placed in a limited space are needed.

SUMMARY

The following presents a simplified summary of one or more implementations in order to provide a basic understanding of some implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

According to one feature, a method of manufacturing a stacking interposer is provided. The method includes forming a multi-cell, multilayer printed circuit board panel having a plurality of interposer cell sites; slotting the panel using a diamond saw process to form inner walls of cell cavities; forming a cavity at each interposer cell site on the panel using the diamond saw process, the inner corners of each cavity having a square configuration; removing remaining material, using a router bit, left behind by slotting process; and cutting outer interposer walls using the diamond saw process. The inner walls of the cell cavities are cut to a controlled depth. The controlled depth may be less than the thickness of the panel resulting in partial cuts into the panel to form the inner wall of the cell cavities.

The stacking interposer may be placed over a first ball grid array dynamic random access memory (DRAM) device and coupled to a dual in-line memory module (DIMM) printed circuit board. A second ball grid array dynamic random access memory (DRAM) device is coupled to a top surface of the stacking interposer. The first ball grid array dynamic random access memory (DRAM) device is received in the cavity of the stacking interposer and a gap is formed between the stacking interposer and the first ball grid array dynamic random access memory (DRAM) device.

According to another feature, a method of manufacturing a stacking interposer is provided. The method includes forming a multi-cell, multilayer printed circuit board panel having a plurality of interposer cell sites; forming a cavity at each interposer cell site on the panel using a router process; cutting inner cavity walls and outer cavity walls of the each interposer cell site using a single diamond saw process; and removing remaining material, using a router bit, left behind when forming the cavity at the each interposer cell site. The inner cavity walls and outer cavity walls are cut to a controlled depth. The controlled depth is less than the thickness of the panel resulting in partial cuts into the panel to form the inner cavity walls and outer cavity walls.

The stacking interposer may be placed over a first ball grid array dynamic random access memory (DRAM) device and coupled to a dual in-line memory module (DIMM) printed circuit board. A second ball grid array dynamic random access memory (DRAM) device may be coupled to a top surface of the stacking interposer. The first ball grid array dynamic random access memory (DRAM) device is received in the cavity of the stacking interposer and a gap is formed between the stacking interposer and the first ball grid array dynamic random access memory (DRAM) device.

According to another feature, a method of manufacturing a ball grid array module is provided. The method includes depositing solder paste on a primary side of a dual in-line memory module (DIMM) printed circuit board using a surface mount technology solder paste stencil process; placing a first dynamic random access memory device on the deposited solder paste; placing a stacking interposer over the first dynamic random access memory device; dipping solder balls of a second dynamic random access memory device in flux; placing the dipped solder balls of the second first dynamic random access memory device on a top surface of the stacking interposer; and performing a single reflow cycle to form solder connections between the second dynamic random access memory device and the interposer, between the interposer and the DIMM printed circuit board, and between the first dynamic random access memory device and the DIMM printed circuit board.

The stacking interposer has a cavity formed by inner walls connected at corners having a square configuration. The cavity is configured to receive the first dynamic random access memory device and a gap is formed between the stacking interposer and the first dynamic random access memory device.

DETAILED DESCRIPTION

In the following detailed description, numerous specific details are set forth in order to provide a thorough understanding of the embodiments. However, it will be understood by one of ordinary skill in the art that the embodiments may be practiced without these specific details. For example, operations may be shown in block diagrams, or not be shown at all, in order not to obscure the embodiments in unnecessary detail. In other instances, well-known operations, structures and techniques may not be shown in detail in order not to obscure the embodiments.

Overview

According to one aspect, a method for forming a stacking interposer that creates a compact and/or reliable interposer cavity is provided. The method involves a novel segmentation process that partially cuts a multi-cell, multi-layer PCB panel to a controlled depth along internal walls/edges of a cavity region within each of the interposer cell sites defined within the PCB panel. The material within the cavity region is then removed (by routing) to a controlled depth to form the internal cavity (i.e., bind cavity) for each of the interposer cell sites. The pillars may then be cut from the PCB panel. As a result of the initial partial cuts of the internal walls of the cavity region, the corners of the cavities may have a square configuration for fitting over the top of a BGA/memory device (which has very square corners). Consequently, the squaring of the cavity allows for a better fit over a BGA/memory device, which consequently leads to a more compact interposer size.

Additionally, the corners of the cavities may be partially drilled to a controlled depth to remove pillars formed from the partial cuts of the PCB panel. Such removal of pillars forms an air gap from the outside to the inside cavity along the corners of the cavity at each interposer cell site.

The interposer may then be used for stacking, for example, memory devices. The stacking interposer may create a vertical riser that makes electrical connections from an upper BGA device mounted on top of the stacking interposer to a base substrate (e.g., memory DIMM PCB). For instance, an upper BGA/memory device may be mounted on the top side of the interposer while a lower BGA/memory device may be housed within the cavity of the interposer. In one example, the interposer does not necessarily join upper and lower memory devices electrically or mechanically.

According to another aspect, the interposer may be used to permit coupling memory devices onto a base substrate (e.g., memory DIMM PCB) using a single reflow process. A lower BGA/memory device is placed on the base substrate (e.g., memory DIMM PCB), and then the stacking interposer is placed over the lower BGA/memory device. Next, the upper BGA/memory device is placed over the stacking interposer. The whole assembly is then reflowed to form the solder connections.

Package Having Stacked Ball Grid Array (BGA) DRAM Components

Figure 1:
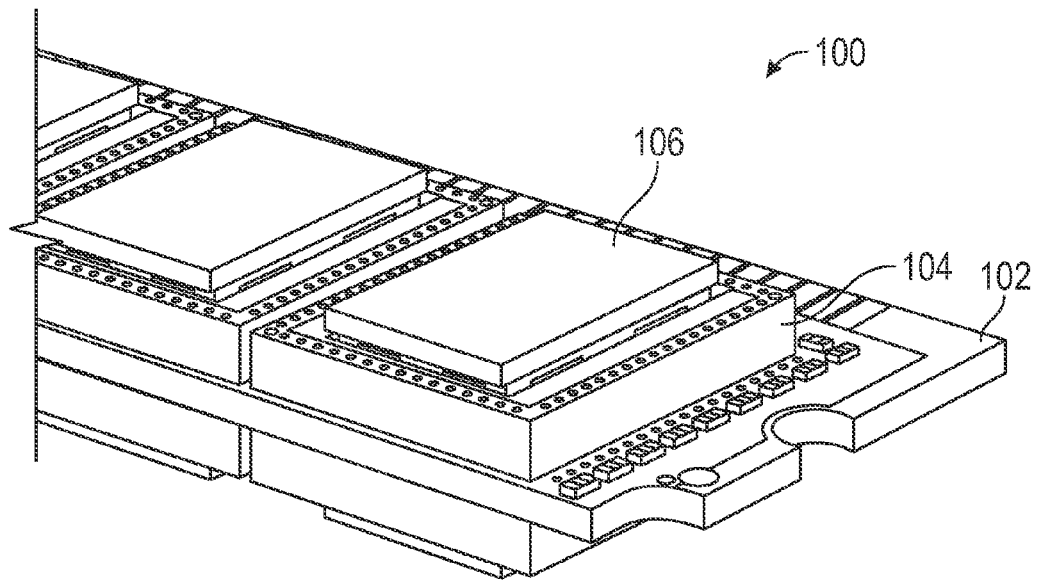
FIG. 1 illustrates a side perspective view of a package having stacked Ball Grid Array (BGA) DRAM components on JEDEC standard DDR2 and DDR3 DIMMs, according to one aspect.

FIG. 1 illustrates a side perspective view of a package 100 having stacked Ball Grid Array (BGA) Dynamic random-access memory (DRAM) components on Joint Electron Devices Engineering Council (JEDEC) standard double data rate (DDR)2 and DDR3 dual in-line memory modules (DIMM), according to one aspect. As shown, the package 100 may include a printed circuit board panel 102 having a plurality of stacking interposers 104 mounted to a first side of the printed circuit board panel 102 as well as a second opposing side of the printed circuit board panel 102. Lower BGA DRAM devices (not shown) may be located under the plurality of stacking interposers 104 and upper lower BGA DRAM devices 106 may be located on top of the plurality of stacking interposers 104.

Figure 2:
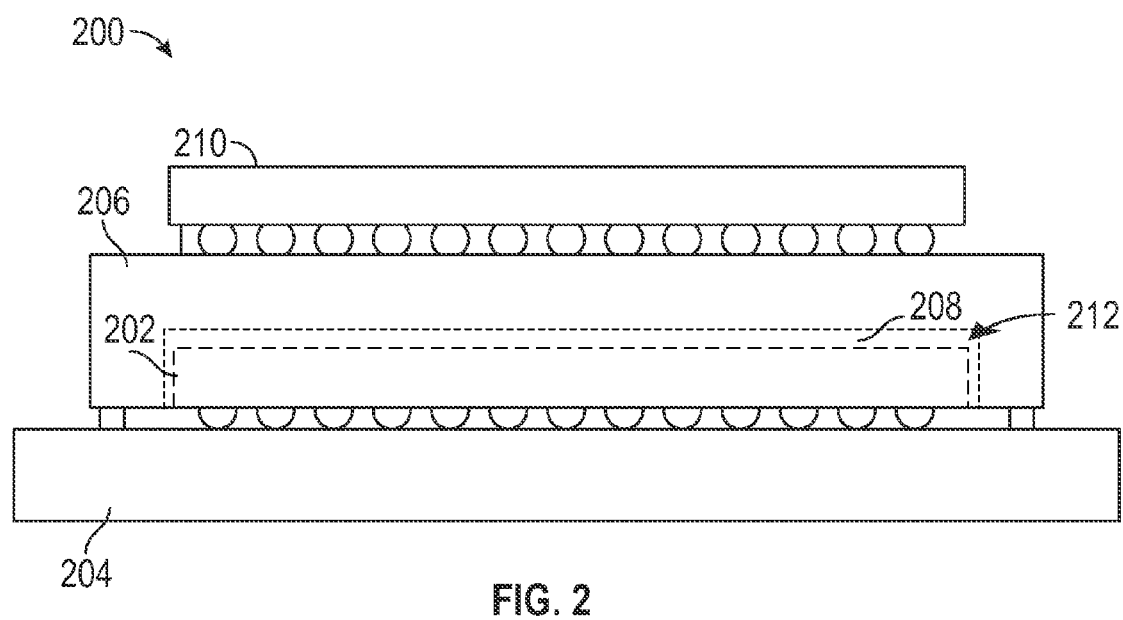
FIG. 2 illustrates a cross-sectional view of a package utilizing a stacking interposer to mount an upper BGA chip over a lower BGA chip multilayer printed circuit board (PCB) panel, according to one aspect.

FIG. 2 illustrates a cross-sectional view of a package utilizing a stacking interposer to mount an upper BGA chip over a lower BGA chip on a multilayer PCB panel, according to one aspect. As shown, the package 200 may comprise a lower BGA DRAM device 202 directly coupled to a DIMM PCB 204. A stacking interposer 206, as described in further detail below, may be positioned over the lower BGA chip 202, such as a BGA DRAM device, and the upper BGA chip 210, such as upper BGA DRAM device, may be mounted to a top surface of the stacking interposer 206. In one aspect, the stacking interposer 206 may include a cavity 208 adapted to receive the lower BGA DRAM device 202 and form a gap 212 between the stacking interposer 206 and the lower BGA DRAM device 202. If such gap 212 can be minimized, then the interposer 206 can be made smaller and more chips 202 can be fit within a given area. After placement (or coupling), the lower BGA DRAM device 202, the stacking interposer 206 and the upper BGA DRAM device 210 may be simultaneously ultrasonically welded or soldered in place.

Multi-Cell, Multilayer Printed Circuit Board (PCB) Panel

Figure 3:
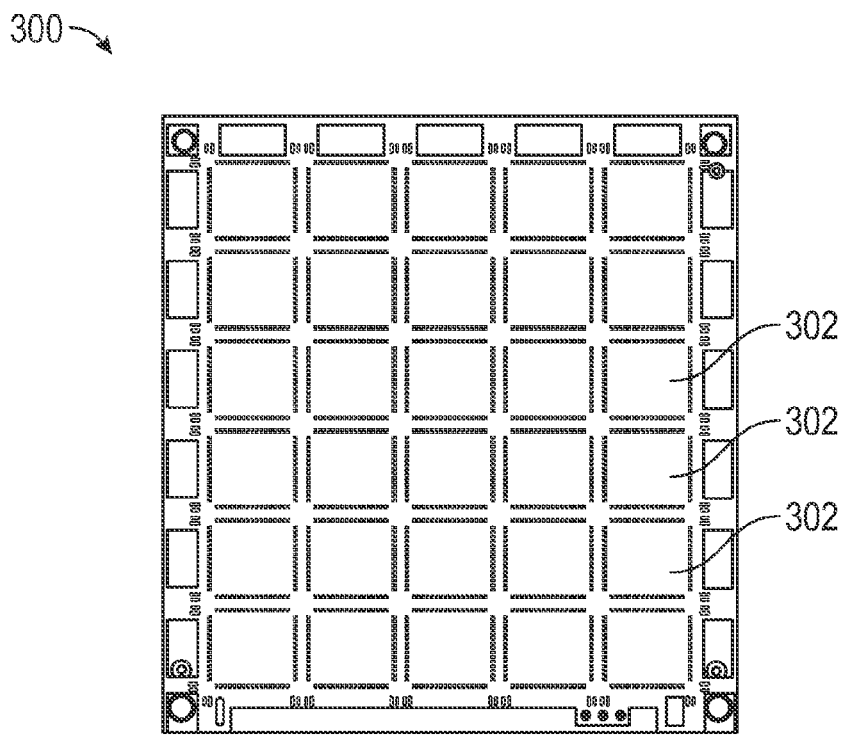
FIG. 3 illustrates a multi-cell, multilayer printed circuit board (PCB) panel used in the manufacturing of a stacking interposer, according to one aspect.

The process of fabricating a stacking interposer starts with a FR4 multilayer printed circuit board (PCB) panel manufactured using mainstream high speed multilayer PCB fabrication techniques. An example of a multi-cell, multilayer printed circuit board (PCB) panel 300 used in the manufacturing of a stacking interposer of the present disclosure is illustrated in FIG. 3 As shown, the PCB panel 300 may be comprised of a plurality of interposer cells 302. Although thirty (30) interposer cells are shown (six (6) rows with five (5) interposer cells per row), this is by way of example only. The PCB panel 300 may include more than or less than (6) rows and each row may include more than or less than (5) interposer cells. According to one example, the PCB panel size may be approximately 4"×3" with a thickness of 1.9 mm and a layer count of four (4).

Diamond Saw Process

Once the PCB panel 300 has been created, the next step in the process is to form controlled-depth cavities at each interposer cell site on the PCB panel 300. One approach to forming a controlled-depth cavity in the PCB panel 300 is to use a typical router bit process on a computer numerical control (CNC) mill as is known in the art. A typical tolerance of a feature in a PCB cut with this router process is +/−0.005 in.

In the present disclosure however, to minimize the overall X-Y footprint of the BGA stack, tighter tolerances are utilized and the inner corners of the cavity are formed as square as possible. To obtain the tighter tolerances and square inner corners, a diamond saw process is utilized to form side walls of a cell cavity 308 and form outer walls 310 of a stack interposer (See FIG. 6).

Figure 4:
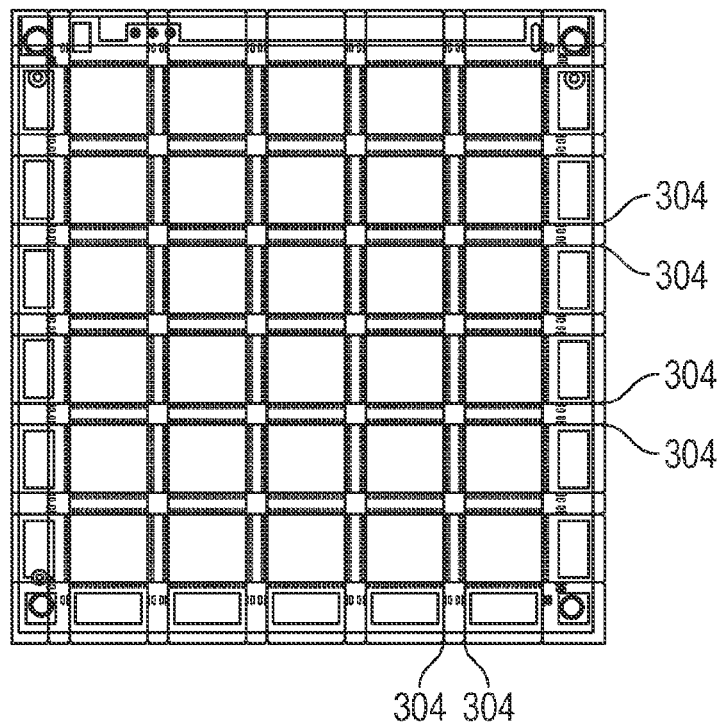
FIG. 4 illustrates the PCB panel of FIG. 3 slotted using a diamond saw process.

As shown in FIG. 4, the PCB panel 300 is "slotted" using the diamond saw process. By "slotting" the PCB panel 300, the saw blade is used to cut the PCB panel 300 to a controlled depth (i.e. partial cut 304), stopping short of cutting all of the way through the PCB panel 300 leaving the PCB panel 300 intact. At this stage, a saw cut is made for each inner wall only and the outer walls of the interposers are cut at a later stage.

Forming Cavities

Next, cell cavities of the slotted PCB panel 300 in FIG. 4 are formed using typical PCB routing equipment. As the inner walls of the cavity are formed utilizing the diamond saw process as described above in reference to FIG. 4, the router bit is used to clear out any remaining material left behind by the slotting process and is not needed to form the cavity walls.

Figure 5:
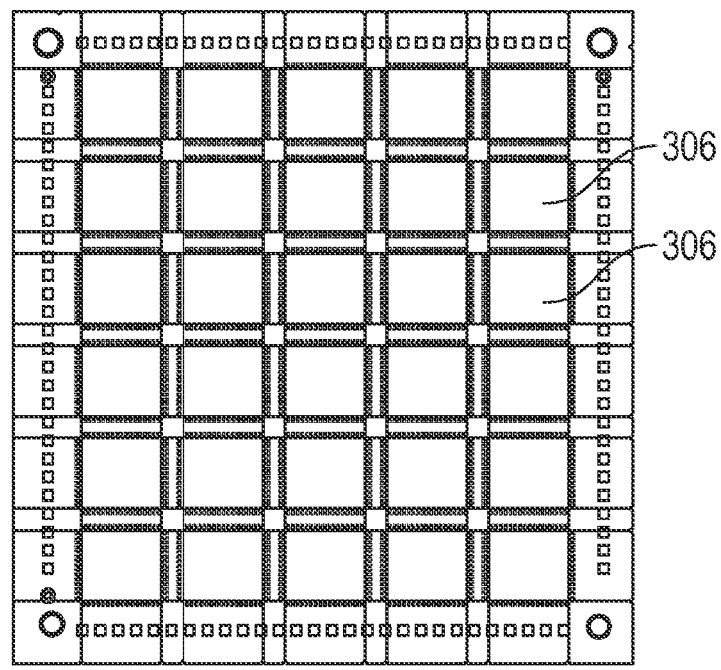
FIG. 5 illustrates cavities on the PCB panel of FIG. 4 after routing to clear out pillars.

As described above, using the diamond saw process results in the corners of the cavity walls being square. FIG. 5 illustrates the square cavities 306 formed on the PCB panel 300 of FIG. 4 using the diamond saw process. If the inner corners of the cavity were formed with a standard router bit, the cavities would effectively be rounded (with approximate radius equal to the router bit radius). As a result, the overall cavity would be larger as the cavity must fit over the top of a BGA DRAM device (which has very square corners). Thus, using the diamond saw process enables a more area-efficient stacking interposer.

Figure 6:
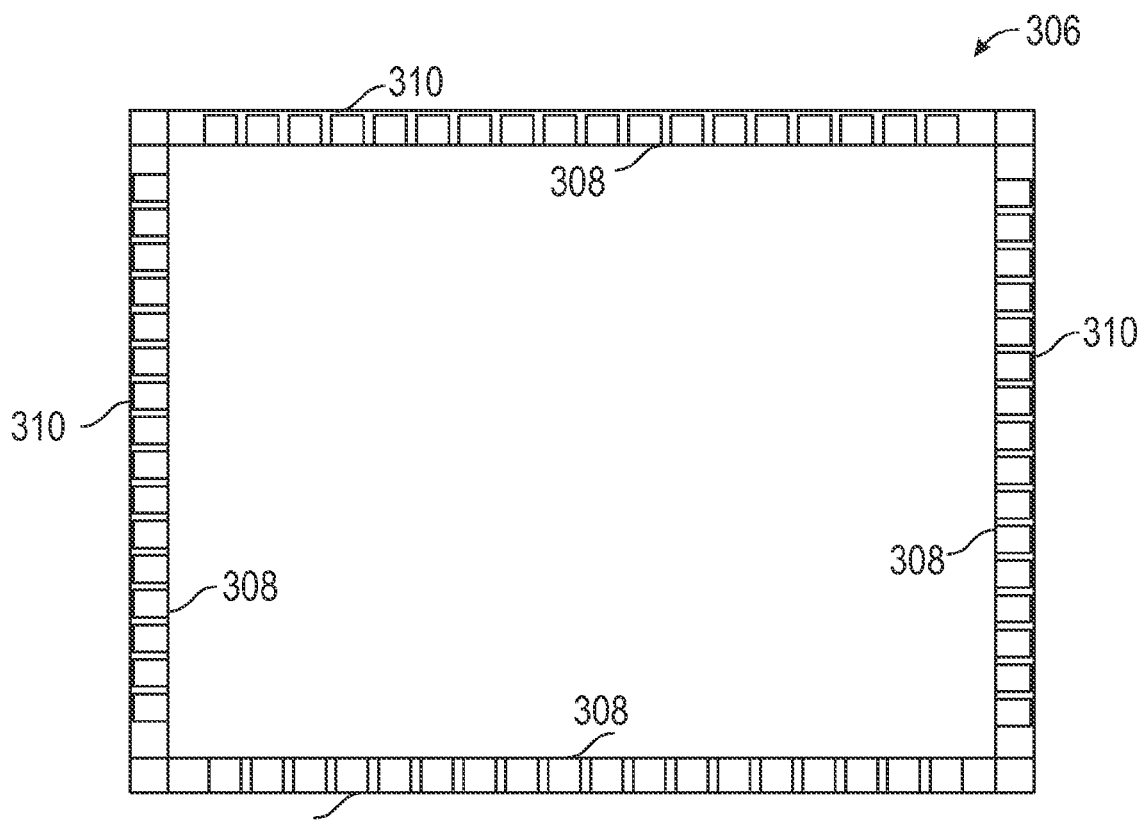
FIG. 6 illustrates the inner side walls of the cavity and outer side walls of a cavity formed on the PCB panel of FIG. 5.

Once the cavities 306 have been formed in the PCB panel 300, the PCB panel 300 is placed back on the diamond saw equipment and the outer interposer walls are cut, singulating the stack interposer cells from the PCB panel 300. FIG. 6 illustrates the inner side walls 308 of a cavity and outer side walls 310 of the interposer formed on the PCB panel of FIG. 5.

Removal of Pillars

Figure 7:
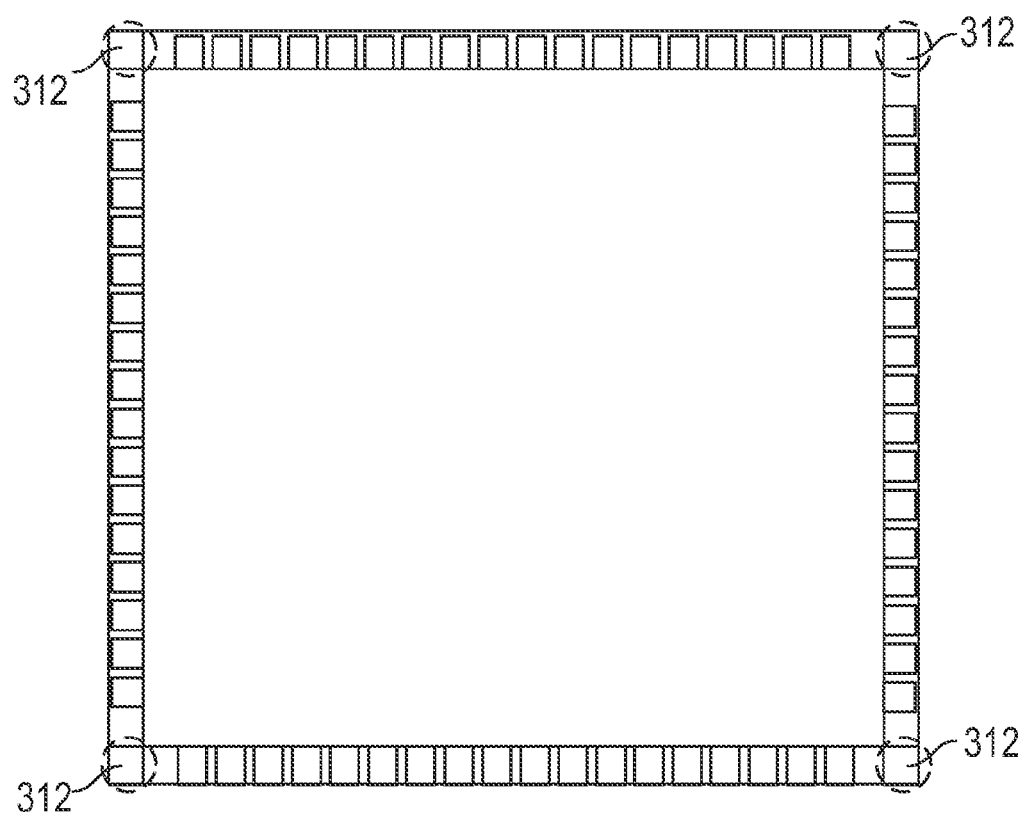
FIG. 7 illustrates an example of drilling out the pillars prior to cutting the interposer walls.

After the diamond saw process have been used to cut the inner and outer walls, the FR4 pillars 312 left behind as a result of the diamond saw process are removed. If the pillars 312 are not removed, the pillars 312 can break off potentially leaving debris in the DIMM assemblies. To prevent the pillars 312 breaking off and leaving debris behind, the pillars 312 are drilled out prior to the interposer walls being cut so that the no pillars are left behind. FIG. 7 illustrates an example of drilling out the pillars 312 prior to cutting the interposer walls.

Stacking Interposer Fabrication

Figure 8:
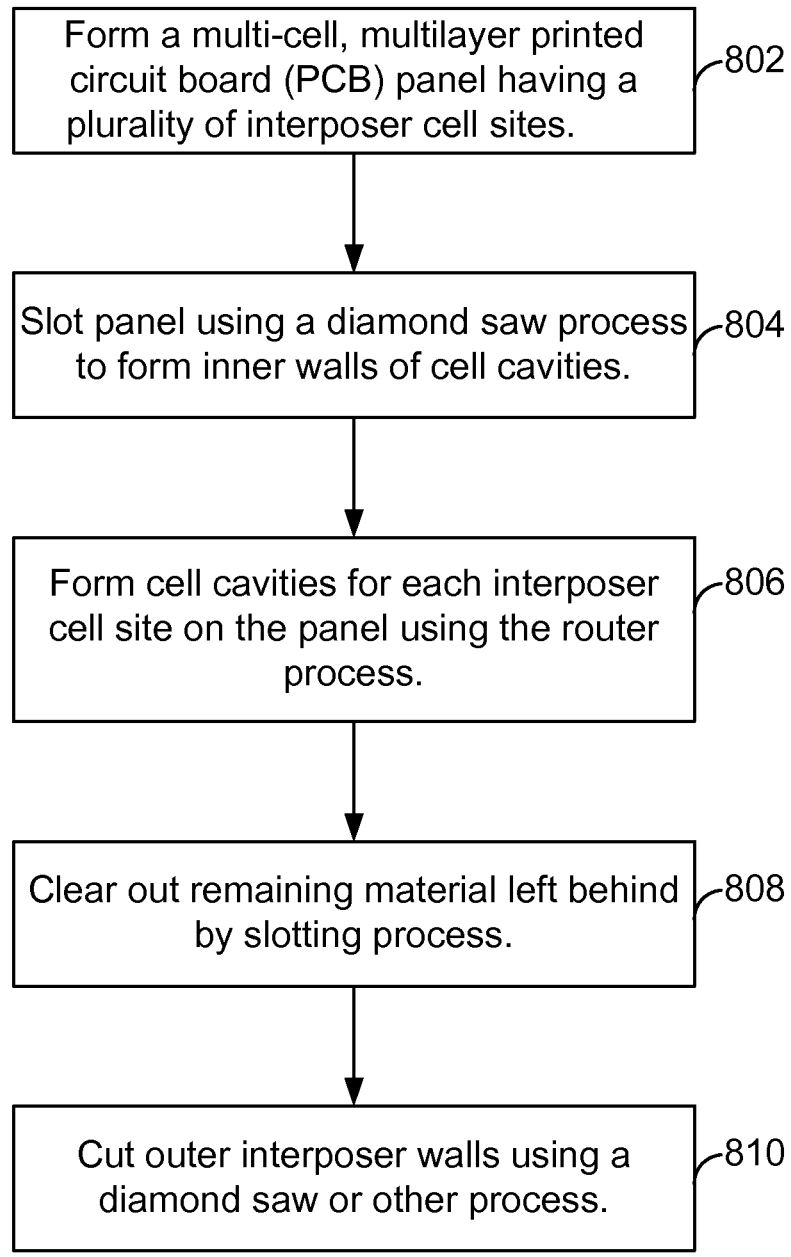
FIG. 8 illustrates a method of manufacturing a stacking interposer, according to a first aspect.

FIG. 8 illustrates a method of manufacturing a stacking interposer, according to one aspect. As discussed above and as shown in FIG. 3, fabrication of a stacking interposer may begin with the formation of a multi-cell, multilayer PCB panel 802. The panel may be manufactured using mainstream high speed multilayer PCB fabrication techniques known in the art. The layer count, PCB thickness, dimensions, and the number of stacking interposer cells on the panel can vary.

Once the panel has been formed, controlled-depth cavities may be formed at each interposer cell site on the panel using a diamond saw process, such as the diamond saw process used to singulate silicon chips from silicon wafers. As described above, by using a diamond saw process, the overall X-Y footprint of the BGA stack may be minimized and tighter tolerances may be obtain, as compared to the typical tolerance of +/−0.005 inches in a PCB cut with the conventional router process. Additionally, using the diamond saw process provides for the inner corners of each cavity to have a notched out or square configuration.

Using the diamond saw process, the inner side walls of each cell cavity of the stacking interposer may be formed. That is, the PCB panel may be "slotted" using the diamond saw process 804 (See FIG. 4). The saw blade may cut to a controlled depth (e.g., the depth of the cavity), short of cutting all of the way through the panel leaving the panel intact. The saw cut is made for each inner wall; the outer walls of the stacking interposers may be cut at a later stage in the process. Once the panel has been slotted, the slotted panel may then be placed on standard PCB routing equipment (e.g., router), where the cell cavities are formed 806. (See FIG. 5) As the diamond saw process has previously formed the cavity inner walls, a router bit is not needed to form the cavity walls.

Optionally, because the slotting process may leave "pillars" at the corner of the interposer, a router bit may also be used to notch out the corners (at least to the depth of the cavity) 808. (See FIG. 7) Clearing out the remaining material or "pillars" left behind by the slotting process avoids the possibility that the pillars can break off, potentially leaving debris in the DIMM assemblies. As such, the pillars may be drilled out prior to cutting the interposer walls so that no pillars are left behind. By removing the pillars, an air gap may be created allowing for air movement into and out of the cavity.

Furthermore, having straight corners may be advantageous as the DRAM devices located within the cavity are typically square so the stacking interposer may be brought up to the edges of the DRAM device which in turn saves space on the board.

Additionally, as a cut has already been created by forming slots with the diamond saw blade, the router bit is not needed to cut and define the inner side walls of the cavity. Consequently, as described above, a much more accurate, tighter tolerance cavity having notched out or square corners may be obtained. If the side walls of the cavity were cut with a router bit, the inner corners of the cavity may have a circular or rounded feature which would require the cavities to be bigger to fit over the DRAM devices.

Once the cavities have been formed, the panel may be placed back on the diamond saw equipment and the outer interposer walls are cut, singulating the stacking interposer cells from the panel 810.

In view of the above, a stacking interposer for use in semiconductor packaging may be prepared by the process comprising the steps of (a) forming a multi-cell, multilayer printed circuit board panel having a plurality of interposer cell sites; (b) slotting the panel using a diamond saw process to form inner walls of cell cavities; (c) forming a cavity at each interposer cell site on the panel using the diamond saw process, the inner corners of each cavity having a square configuration; (d) removing remaining material left behind by slotting process; and (e) cutting outer interposer walls using the diamond saw process.

Figure 9:
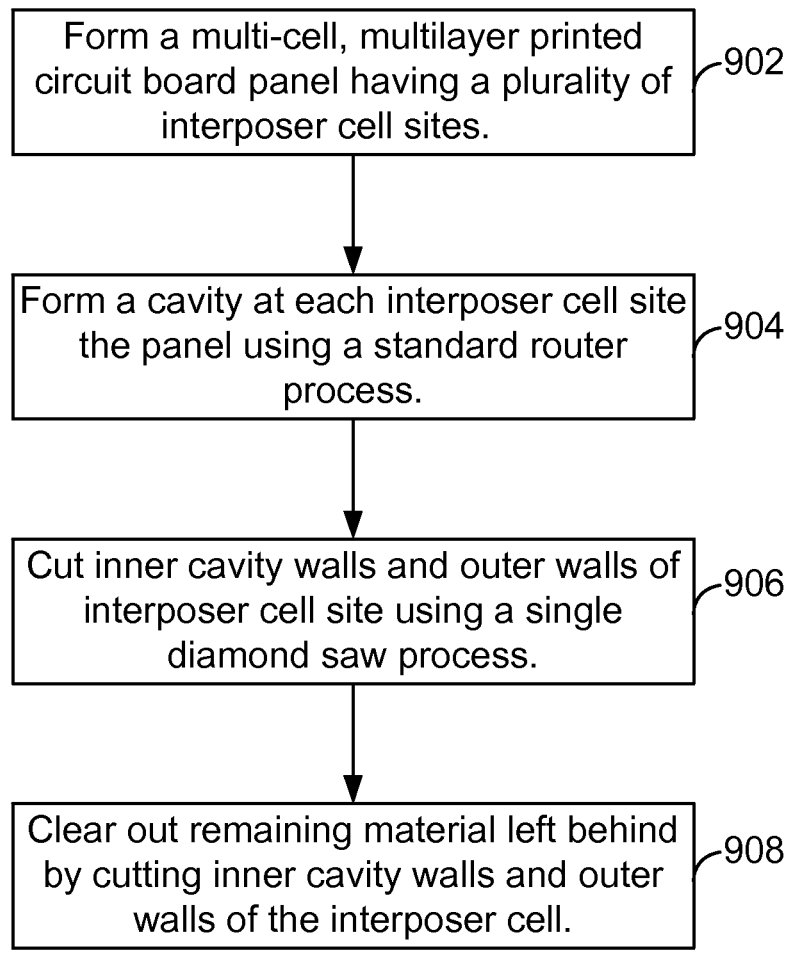
FIG. 9 illustrates a method of manufacturing a stacking interposer, according to a second aspect.

FIG. 9 illustrates a method of manufacturing a stacking interposer, according to a second aspect. According to the second aspect, the order of the steps for fabricating the stacking interposer may be rearranged so that the diamond saw process is only used once. In this method, a multi-cell, multilayer PCB panel is formed 902. Next, the cavities may be formed in the panel using a standard router process 904 as is known in the art. Using a diamond saw, the inner cavity side walls and the outer walls of the interposer cell sites are cut 906. By cutting the inner cavity side walls and the outer walls of the interposer cell sites, the diamond saw equipment only needs to be set up once.

A router bit may then be used to form notched out corners in the interposer cell site by clearing out the remaining material, or "pillars", 908 left behind by the cutting of the inner cavity walls and the outer walls of the interposer cell site.

In view of the above, a stacking interposer for use in semiconductor packaging may be prepared by the process comprising the steps of (a) forming a multi-cell, multilayer printed circuit board panel having a plurality of interposer cell sites; (b) forming a cavity at each interposer cell site on the panel using a router process; (c) cutting inner cavity walls and outer cavity walls of the each interposer cell site using a single diamond saw process; and (d) removing remaining material left behind when forming the cavity at the each interposer cell site.

Stacked DIMM Assembly Process

In typical stacking processes in the industry, the DRAM devices are exposed to two reflow cycles. The first reflow cycle is stack assembly formation and the second reflow cycle is stack attachment to the DIMM PCB.

Figure 10:
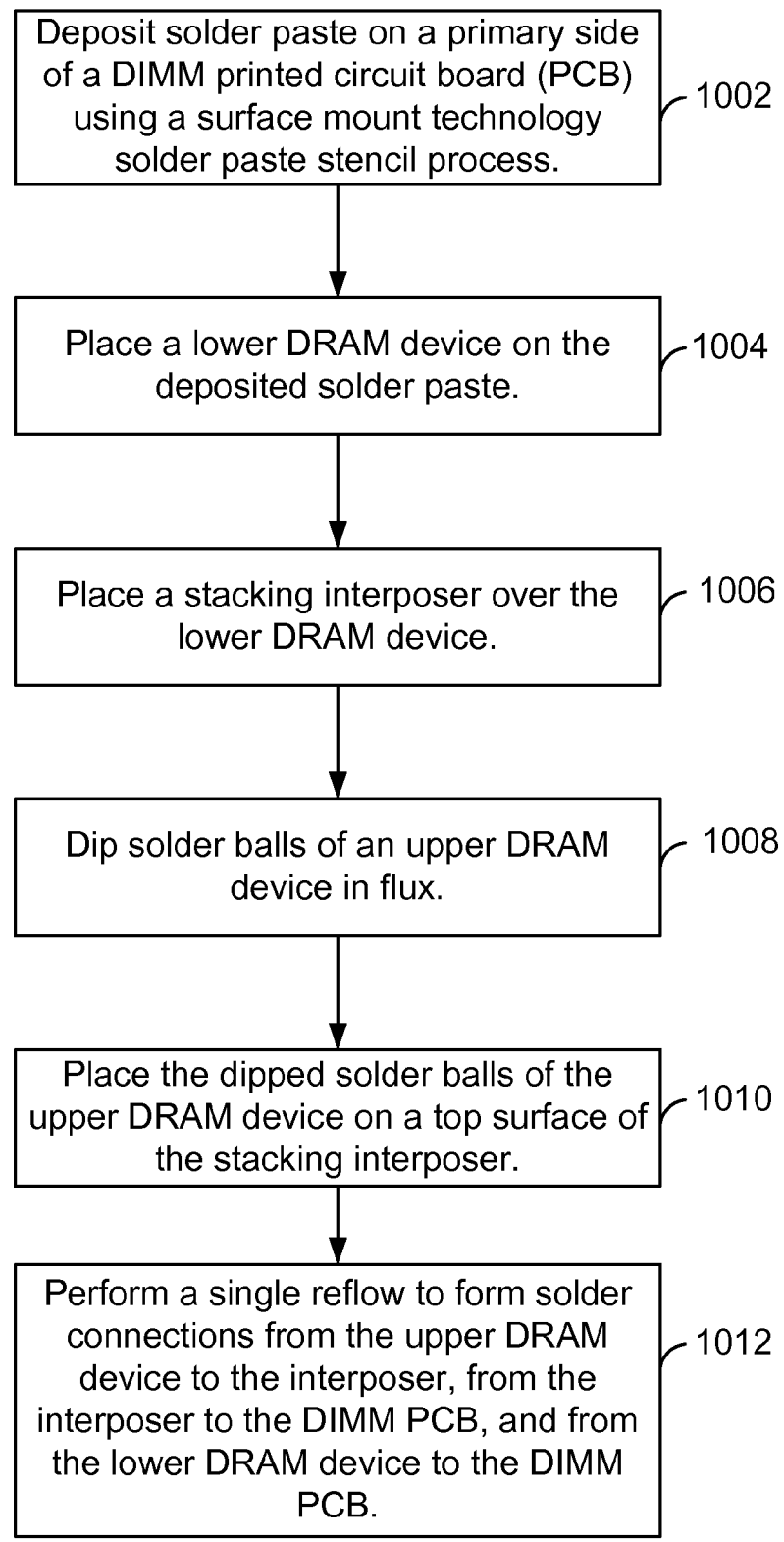
FIG. 10 illustrates a method of manufacturing a memory module using a single reflow cycle, according to one aspect.

In present disclosed stacked DIMM assembly process, however, the DRAM devices on a given DIMM surface are exposed to only one surface mount technology (SMT) reflow cycle. FIG. 10 illustrates a method of manufacturing a ball grid array module using a single reflow cycle, according to one aspect. By stacking the DIMM assembly and then performing a single reflow cycle for the whole assembly reduces the number of reflow cycles on the DRAM increasing the quality and reliability of the assembly.

To form a stacked DIMM assembly, solder paste may first be deposited down on a primary side of a base substrate (e.g., DIMM PCB) using, for example, a SMT solder paste stencil process 1002. The solder paste may be deposited on the pads for both a first (or lower) DRAM device and the stacking interposer in one solder paste deposition operation. Next, the first (or lower) DRAM device may be placed on deposited solder paste using pick and place equipment 1004. The stacking interposer may then be placed over the top of the first (or lower) DRAM device using the pick and place equipment 1006.

Solder balls of a second (or upper) DRAM device may be dipped in flux 1008 and then placed on the top of the stacking interposer using standard pick and place equipment. The DIMM may then be reflowed to form the solder connections from the second (or upper) DRAM device to the interposer, from the interposer to the DIMM PCB, and from the first (or lower) DRAM device to the DIMM PCB 1012. This same process may be repeated for a second side of the DIMM PCB, completing assembly of the entire stacked DIMM.

In view of the above, a ball grid array module may be prepared by the process comprising the steps of (a) depositing solder paste on a primary side of a dual in-line memory module (DIMM) printed circuit board using a surface mount technology solder paste stencil process; (b) placing a first dynamic random access memory device on the deposited solder paste; (c) placing a stacking interposer over the first dynamic random access memory device; (d) dipping solder balls of a second dynamic random access memory device in flux; (e) placing the dipped solder balls of the second first dynamic random access memory device on a top surface of the stacking interposer; and (f) performing a single reflow cycle to form solder connections between the second dynamic random access memory device and the interposer, between the interposer and the DIMM printed circuit board, and between the first dynamic random access memory device and the DIMM printed circuit board.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The invention claimed is:

1. A method of manufacturing a stacking interposer, comprising:
    forming a multi-cell, multilayer printed circuit board panel having a plurality of interposer cell sites;
    slotting the panel using a diamond saw process to form inner walls of cell cavities;
    forming a cavity at each interposer cell site on the panel using the diamond saw process, the inner corners of each cavity having a square configuration;
    removing remaining material left behind by slotting process; and
    cutting outer interposer walls using the diamond saw process.

2. The method of claim 1, wherein the inner walls of the cell cavities are cut to a controlled depth.

3. The method of claim 2, wherein the controlled depth is less than the thickness of the panel resulting in partial cuts into the panel to form the inner wall of the cell cavities.

4. The method of claim 1, wherein the remaining material is removed using a router bit.

5. The method of claim 1, wherein the stacking interposer is placed over a first ball grid array dynamic random access memory (DRAM) device and coupled to a dual in-line memory module (DIMM) printed circuit board.

6. The method of claim 5, wherein a second ball grid array dynamic random access memory (DRAM) device is coupled to a top surface of the stacking interposer.

7. The method of claim 5, wherein the first ball grid array dynamic random access memory (DRAM) device is received in the cavity of the stacking interposer.

8. The method of claim 7, wherein a gap is formed between the stacking interposer and the first ball grid array dynamic random access memory (DRAM) device.

9. A method of manufacturing a stacking interposer, comprising:
    forming a multi-cell, multilayer printed circuit board panel having a plurality of interposer cell sites;
    forming a cavity at each interposer cell site on the panel using a router process;

cutting inner cavity walls and outer cavity walls of the each interposer cell site using a single diamond saw process; and removing remaining material left behind when forming the cavity at the each interposer cell site.

10. The method of claim 9, wherein the inner cavity walls and outer cavity walls are cut to a controlled depth.

11. The method of claim 10, wherein the controlled depth is less than the thickness of the panel resulting in partial cuts into the panel to form the inner cavity walls and outer cavity walls.

12. The method of claim 9, wherein the remaining material is removed using a router bit.

13. The method of claim 9, wherein the stacking interposer is placed over a first ball grid array dynamic random access memory (DRAM) device and coupled to a dual in-line memory module (DIMM) printed circuit board.

14. The method of claim 13, wherein a second ball grid array dynamic random access memory (DRAM) device is coupled to a top surface of the stacking interposer.

15. The method of claim 13, wherein the first ball grid array dynamic random access memory (DRAM) device is received in the cavity of the stacking interposer.

16. The method of claim 15, wherein a gap is formed between the stacking interposer and the first ball grid array dynamic random access memory (DRAM) device.

\* \* \* \* \*